US011233091B2

(12) United States Patent
Cheng

(10) Patent No.: US 11,233,091 B2
(45) Date of Patent: Jan. 25, 2022

(54) RESISTIVE MEMORY CELL HAVING A SINGLE FIN

(71) Applicant: INTERNATIONAL BUSINESS MACHINES CORPORATION, Armonk, NY (US)

(72) Inventor: Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/291,247

(22) Filed: Mar. 4, 2019

(65) Prior Publication Data

US 2020/0286955 A1    Sep. 10, 2020

(51) Int. Cl.
*H01L 27/24*     (2006.01)
*H01L 29/786*    (2006.01)
*H01L 29/66*     (2006.01)
*H01L 29/40*     (2006.01)
*H01L 21/308*    (2006.01)
*H01L 21/762*    (2006.01)
*H01L 21/02*     (2006.01)

(52) U.S. Cl.
CPC .... *H01L 27/2454* (2013.01); *H01L 21/02639* (2013.01); *H01L 21/308* (2013.01); *H01L 21/76224* (2013.01); *H01L 29/401* (2013.01); *H01L 29/6656* (2013.01); *H01L 29/66742* (2013.01); *H01L 29/78642* (2013.01)

(58) Field of Classification Search
CPC ........... H01L 29/66666; H01L 29/7827; H01L 29/42392; H01L 29/78642; H01L 29/78696
See application file for complete search history.

(56) References Cited

U.S. PATENT DOCUMENTS 9,000,409 B2    4/2015  Huo et al.
9,099,385 B2    8/2015  Petti
9,178,000 B1   11/2015  Nardi et al.
(Continued)

OTHER PUBLICATIONS

H. Chang et al., Physical Mechanism of HfO2-based Bipolar Resistive Random Access Memory, Proceedings of 2011 International Symposium on VLSI Technology, Systems and Applications, Apr. 2011, pp. 1-2, IEEE.

(Continued)

*Primary Examiner* — Tony Tran
(74) *Attorney, Agent, or Firm* — Tutunjian & Bitetto, P.C.; Randall Bluestone

(57) ABSTRACT

A method for fabricating a semiconductor device including a resistive memory cell having a single fin includes concurrently forming a vertical transistor and a resistive element on a base substrate, including forming a first gate structure corresponding to a gate of the vertical transistor and a second gate structure corresponding to an electrode of the resistive element, forming a top source/drain layer on a fin formed on a bottom source/drain layer disposed on the base substrate, and forming a plurality of contacts. Forming the plurality of contacts includes forming a first contact corresponding to the first gate structure, a second contact corresponding to the top source/drain region and a third contact corresponding to the second gate structure.

12 Claims, 15 Drawing Sheets

(56) References Cited

U.S. PATENT DOCUMENTS

| | | | |
|---|---|---|---|
| 9,190,491 B1 | 11/2015 | Park | |
| 9,231,055 B2 | 1/2016 | Park | |
| 9,231,103 B2* | 1/2016 | Pellizzer | ............ H01L 29/7827 |
| 9,443,583 B2 | 9/2016 | Pacha et al. | |
| 9,673,102 B2 | 6/2017 | Liu et al. | |
| 2009/0206405 A1* | 8/2009 | Doyle | ............... H01L 29/66795 |
| | | | 257/365 |
| 2013/0270508 A1* | 10/2013 | Li | ....................... H01L 45/1206 |
| | | | 257/4 |
| 2014/0239247 A1* | 8/2014 | Park | .................... H01L 27/2463 |
| | | | 257/4 |

OTHER PUBLICATIONS

Z. Fang et al., Fully CMOS-Compatible 1T1R Integration of Vertical Nanopillar GAA Transistor and Oxide-Based RRAM Cell for High-Density Nonvolatile Memory Application, IEEE Transactions on Electron Devices, Mar. 2013, pp. 1108-1113, vol. 60, No. 3, IEEE.

H. Pan et al., 1Kbit FINFET Dielectric (FIND) RRAM in Pure 16nm FinFET CMOS Logic Process, 2015 IEEE International Electron Devices Meeting (IEDM), Feb. 18, 2016, pp. 10.5.1-10.5.4, IEEE.

* cited by examiner

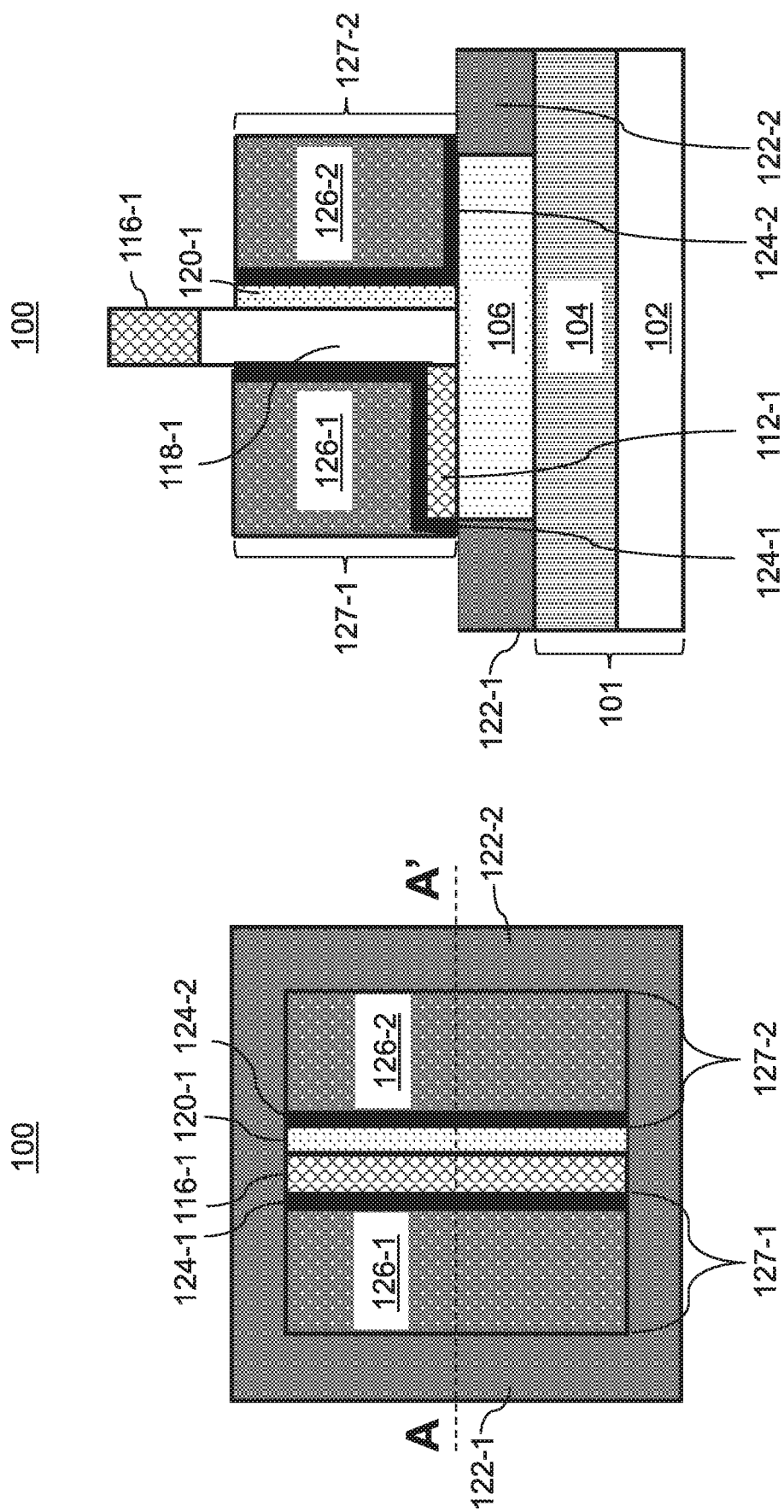

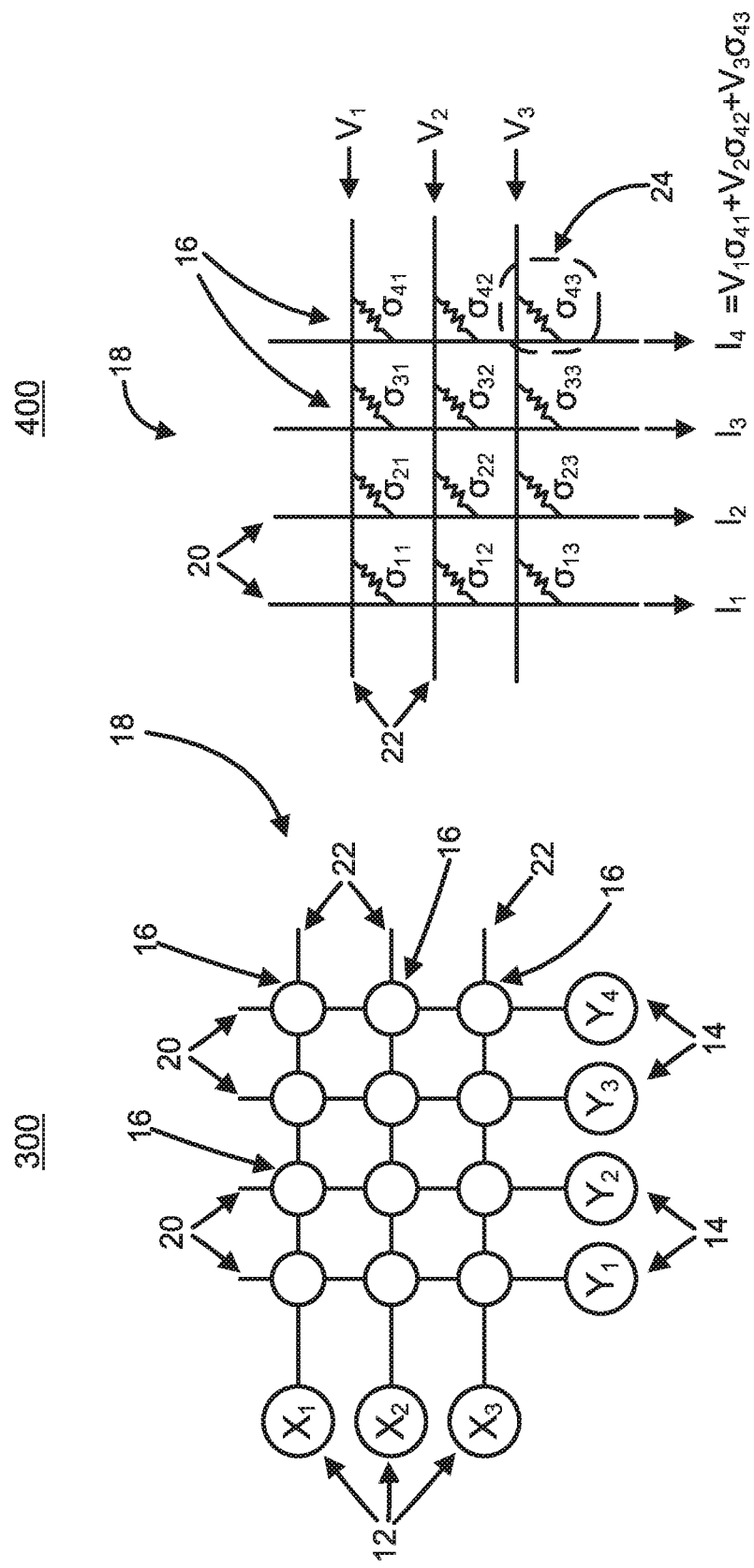

RESISTIVE MEMORY CELL HAVING A SINGLE FIN

BACKGROUND

The present invention generally relates to semiconductor devices, and more particularly to resistive memory cells and methods of forming the same.

A memory cell is a component of a computer memory device that includes an electronic circuit that stores one bit of binary information. One type of memory cell is a random-access memory (RAM) cell. Examples of RAM memory devices include, e.g., volatile memory devices and non-volatile memory devices. One example of a non-volatile memory is resistive random-access memory (ReRAM). ReRAM technology can be used for electronic synapse devices, memristors for neuromorphic or analog computing, and high-density/high-speed non-volatile memory applications. For example, in neuromorphic computing applications, ReRAM can be used as a connection or synapse between a pre-neuron and a post-neuron, representing the connection weight in the form of device resistance, and multiple pre-neurons and post-neurons can be connected through a crossbar array of ReRAM devices to express a fully-connected neural network.

SUMMARY

In accordance with an embodiment of the present invention, a method for fabricating a semiconductor device including a resistive memory cell having a single fin is provided. The method includes concurrently forming a vertical transistor and a resistive element on a base substrate. Concurrently forming the vertical transistor and the resistive element on the base substrate includes forming a first gate structure corresponding to a gate of the vertical transistor and a second gate structure corresponding to an electrode of the resistive element, forming a top source/drain layer on a fin formed on a bottom source/drain layer disposed on the base substrate, and forming a plurality of contacts. Forming the plurality of contacts includes forming a first contact corresponding to the first gate structure, a second contact corresponding to the top source/drain region and a third contact corresponding to the second gate structure.

In accordance with another embodiment of the present invention, a method for fabricating a semiconductor device including a resistive memory cell having a single fin is provided. The method includes concurrently forming a vertical transistor and a resistive element on a base substrate. Concurrent forming the vertical transistor and the resistive element on the base substrate includes forming a sidewall spacer on at least one fin formed on a bottom source/drain layer disposed on the base substrate, forming first and second shallow trench isolation (STI) regions on the base substrate adjacent to the bottom source/drain layer, forming a first gate structure corresponding to a gate of the vertical transistor on the first STI region and a second gate structure corresponding to an electrode of the resistive element on the second STI region, forming a top source/drain layer on the at least one fin, and forming a plurality of contacts. Forming the plurality of contacts includes forming a wordline contact corresponding to the first gate structure, a bitline contact corresponding to the top source/drain region and a source line contact corresponding to the second gate structure.

In accordance with yet another embodiment of the present invention, a semiconductor device including a resistive memory cell having a single fin is provided. The device includes a base substrate, a bottom source/drain layer disposed on the base substrate, a fin disposed on the bottom source/drain layer, a top source/drain layer disposed on the fin, a first gate structure corresponding to a gate of a vertical transistor and a second gate structure corresponding to an electrode of a resistive element, and a plurality of contacts. The plurality of contacts include a wordline contact corresponding to the first gate structure, a bitline contact corresponding to the top source/drain region and a source line contact corresponding to the second gate structure.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 11 is a top-down view of the patterning of the gate material to form separate gate structures during the fabrication of the semiconductor device, in accordance with an embodiment of the present invention;

FIG. 12 is a cross-sectional view through the device shown in FIG. 11, in accordance with another embodiment of the present invention;

FIG. 17 is a schematic view of a neuromorphic device architecture, in accordance with an embodiment of the present invention;

FIG. 18 is a schematic diagram of an array of resistive elements cross-connected to row and column conductors and showing a sample output for the neuromorphic device architecture of FIG. 17, in accordance with an embodiment of the present invention.

DETAILED DESCRIPTION

Figure 1:
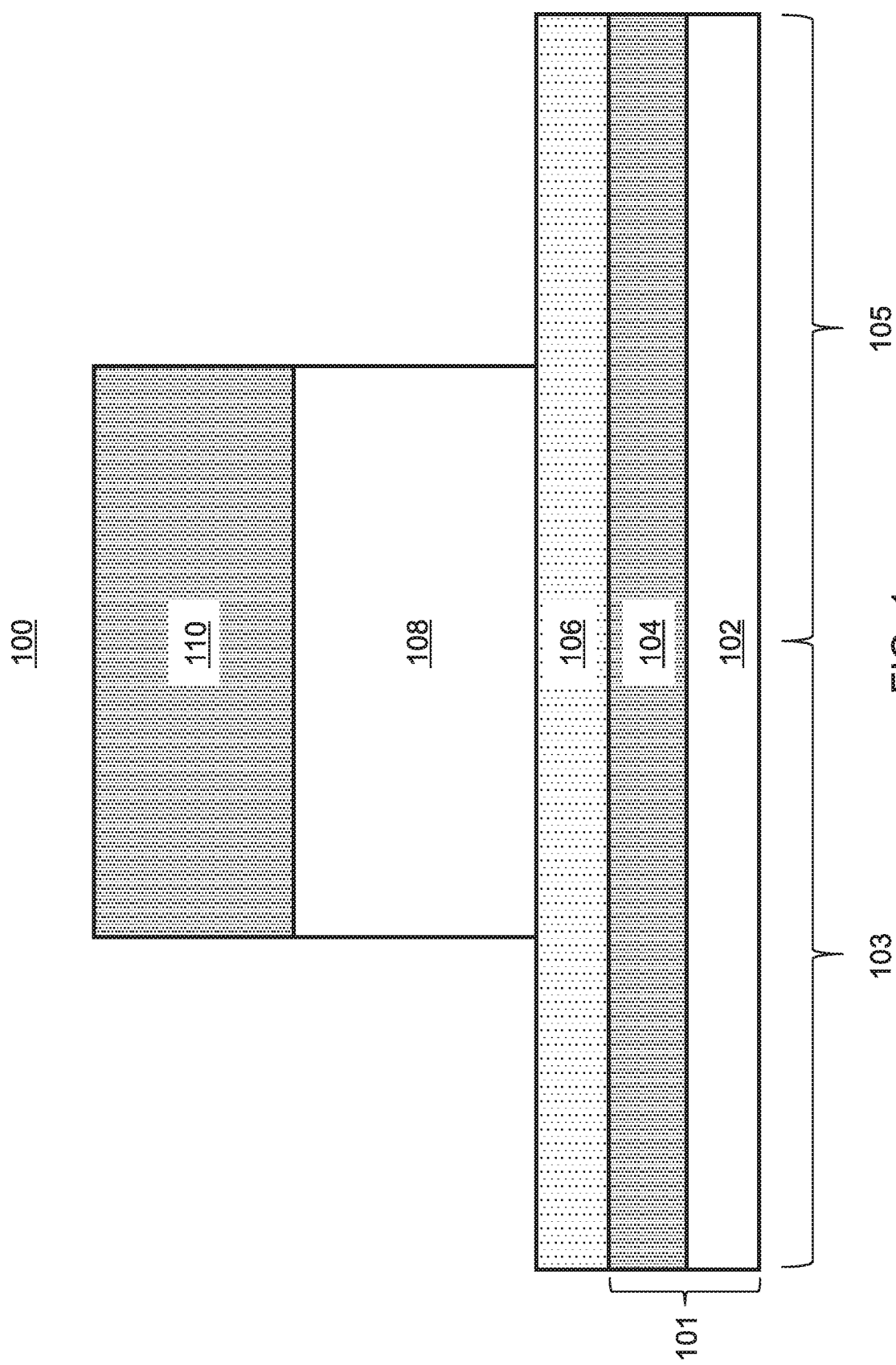
FIG. 1 is a cross-sectional view of the formation of a bottom source/drain region, a channel layer, a mask layer and a pillar through the mask layer and the channel layer during the fabrication of a semiconductor device, in accordance with an embodiment of the present invention.

The embodiments described herein provide for ReRAM devices having a single fin. Illustratively, the embodiments described herein can provide for a ReRAM device including a one-transistor one-resistor ("1T1R") memory cell.

The ReRAM device described herein can work by creating defects (e.g., oxygen vacancies) in a thin dielectric layer (e.g., a memristor element) during a "FORMING" operation, which can be programmed to different logic states such as a low-resistance state (e.g., logic "1" by a "SET" operation) or a high-resistance state (e.g., logic "0" by a "RESET" operation) by changing the polarity of electrical field across the thin dielectric layer. The motion of ions and/or vacancies in the thin dielectric layer results in the formation or break of conduction path (often referred as "filament").

A 1T1R cell can be formed by connecting a transistor (functioning as a selector) in series with the thin dielectric layer corresponding to a resistive element (e.g., memristor element). Illustratively, the transistor can include a vertical field-effect transistor (VFET). The embodiments described herein can provide for improved scalability of ReRAM devices including 1T1R memory cells, which generally have scalabilities limited by the connection of the transistor to the resistive element.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a cross-sectional view of a semiconductor device 100 is provided. Illustratively, as will be described in FIGS. 1-15, the device 100 can include a ReRAM device including a one-transistor one-resistor ("1T1R") memory cell.

As shown, the device 100 includes a base substrate 101. The base substrate 101 can have a first portion corresponding to a first region 103 of the device 100 and a second portion corresponding to a second region 105 of the device 100.

The base substrate 101 can include any suitable substrate structure, e.g., a bulk semiconductor, a semiconductor-on-insulator (SOI) substrate, etc. In one example, the base substrate 101 can include a silicon-containing material. Illustrative examples of Si-containing materials suitable for the base substrate 101 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

Here, the base substrate 101 is shown as a SOI substrate including a semiconductor substrate 102 and a dielectric layer 104 disposed on the semiconductor substrate 102.

In an alternative embodiment, the base substrate can also be a bulk substrate as described above. In the case that the base substrate 101 is a bulk substrate, the dielectric layer 104 is not present.

The dielectric layer 104, if present, can include any suitable material in accordance with the embodiments described herein. For example, the dielectric layer 104 can include, e.g., a silicon oxide material. In one embodiment, the dielectric layer 104 includes a buried oxide layer (BOX).

As further shown, a bottom source/drain layer 106 is formed on the base substrate 101 (e.g., on the dielectric layer 104).

In the embodiment where the base substrate 101 includes an SOI substrate, the bottom source/drain layer 106 can be formed by forming a semiconductor layer on top of the dielectric layer 104, and epitaxially growing material on the semiconductor layer with in-situ doping during epitaxial growth. Dopants can then be driven downwards into the semiconductor layer. The epitaxy layer, in conjunction with the semiconductor layer of the SOI substrate, can form the bottom source/drain layer 106.

In another embodiment where the base substrate 101 includes an SOI substrate, the base substrate 101 can include an SOI substrate with a pre-doped semiconductor layer on top of the dielectric layer 104 to serve as the bottom source/drain layer 106. An SOI substrate can be formed by wafer bonding, SIMOX (Separation by Implanted Oxygen) method, or any other known method to form SOI substrates in accordance with the embodiments described herein.

In an alternative embodiment, if the base substrate 101 includes a bulk semiconductor substrate (e.g., does not include the dielectric layer 104), the bottom source/drain layer 106 can be grown directly on top of the base substrate 101.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

The epitaxial growth process can be done by ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE). Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium (SiGe), and/or carbon doped silicon (Si:C) silicon can be doped during deposition (e.g., in-situ doped) by adding dopants, n-type dopants (e.g., phosphorus or arsenic) or p-type dopants (e.g., boron or gallium), depending on the type of transistor. The dopant concentration in the source/drain can range from about $1\times10^{19}$ cm$^{-3}$ to about $2\times10^{21}$ cm$^{-3}$, or preferably between $2\times10^{20}$ cm$^{-3}$ and $1\times10^{21}$ cm$^{-3}$. When Si:C is epitaxially grown, the Si:C layer may include carbon in the range of 0.2 to 3.0%. When SiGe is epitaxially grown, the SiGe may have germanium content in the range of 5% to 80%, or preferably between 20% and 60%.

In one embodiment, the bottom source/drain layer 106 can include an n-type doped layer (e.g., phosphorus or arsenic doped silicon layer). Alternatively, the bottom source/drain layer 106 can include, e.g., a p-type doped layer (e.g., boron doped silicon germanium layer). However, such embodiments should not be considered limiting.

As further shown, a pillar 108 is formed on the bottom source/drain layer 106, and a mask layer 110 is formed on the pillar 108. The pillar 108 can include any suitable material in accordance with the embodiments described herein. For example, the pillar 108 can include, e.g., undoped Si.

The mask layer 110 can include any suitable material in accordance with the embodiments described herein. In one embodiment, the mask layer 110 includes a hardmask material. For example, the mask layer 110 can include, e.g., a silicon nitride material (e.g., SiN).

In one embodiment, the pillar 108 is formed by epitaxially growing a channel layer on the bottom source/drain layer 106, forming mask material on the channel layer, and patterning through the mask material and the channel layer to form the pillar 108 and the mask layer 110.

Figure 2:
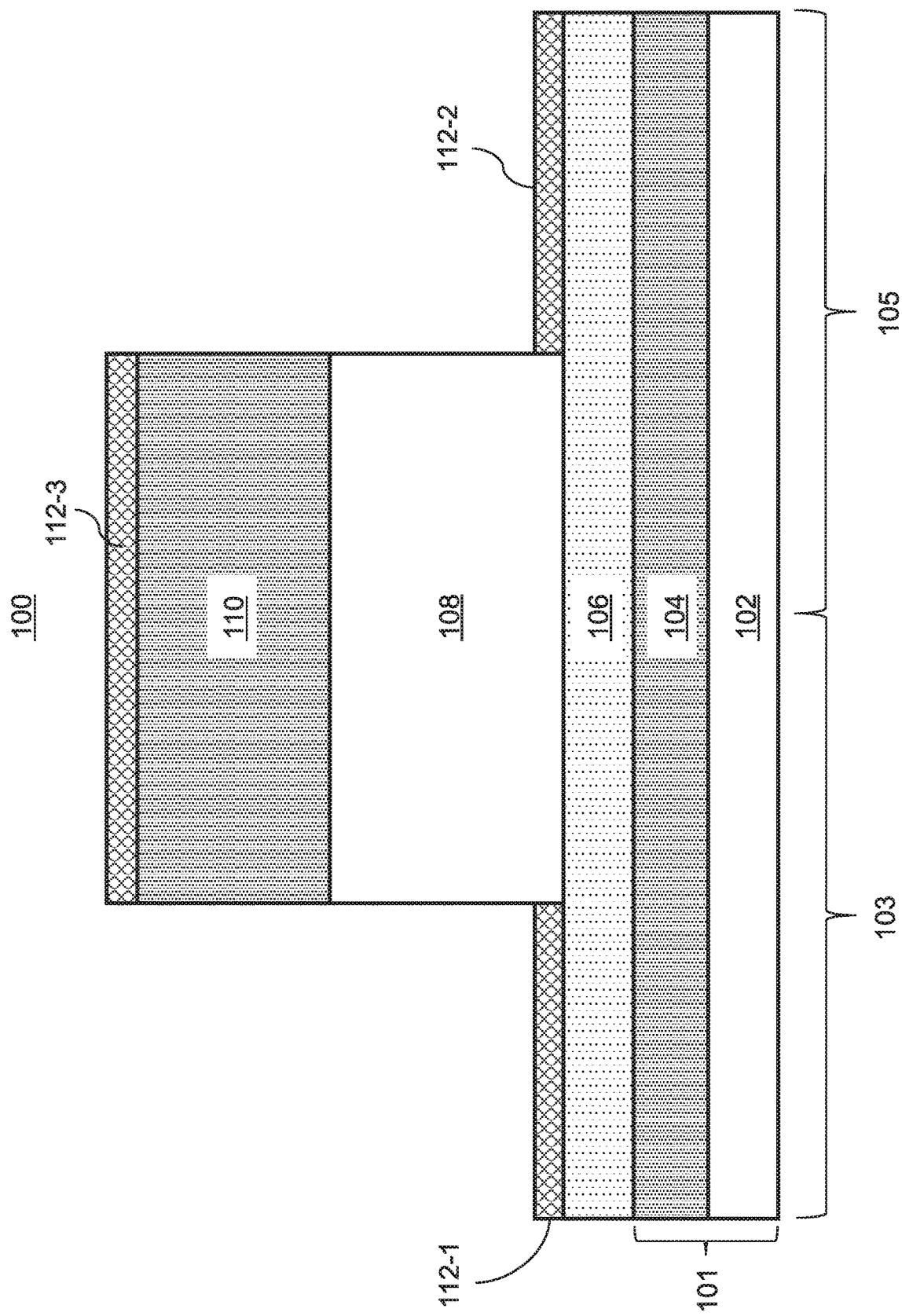
FIG. 2 is a cross-sectional view of the formation of bottom spacer material during the fabrication of the semiconductor device, in accordance with an embodiment of the present invention.

With reference to FIG. 2, bottom spacers 112-1 and 112-2 are formed on the bottom source/drain layer 106, and bottom spacer 112-3 is formed on the mask layer 110. In one embodiment, the bottom spacers 112-1 through 112-3 can be formed by using a directional deposition process to form bottom spacer material, and performing an etch back process to remove any extra bottom spacer material (e.g., remove bottom spacer material from the sidewalls of the pillar 108). For example, the bottom spacers 112-1 through 112-3 can include, e.g., a silicon nitride material (e.g., SiN). However, the bottom spacers 112-1 through 112-3 can be formed by any other suitable techniques with any suitable dielectric material(s). Although each of the bottom spacers 112-1 through 112-3 is depicted as a single layer of dielectric material, they can include a single layer or multiple layers.

Figure 3:
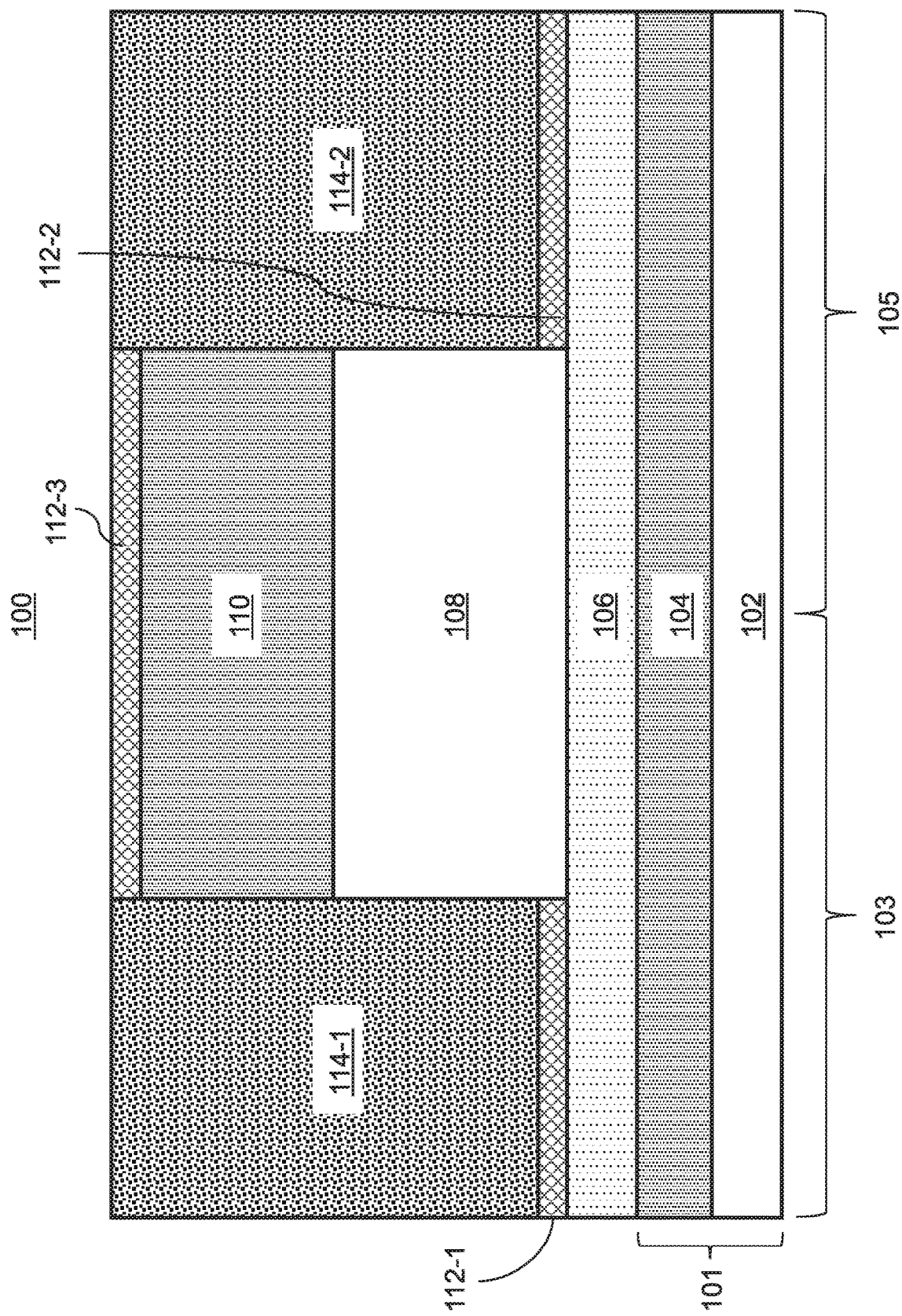
FIG. 3 is a cross-sectional view of the formation of a sacrificial layer and planarization during the fabrication of a semiconductor device, in accordance with an embodiment of the present invention.

With reference to FIG. 3, sacrificial layers 114-1 and 114-2 can be formed on the bottom spacers 112-1 and 112-2, respectively, to a height of the bottom spacer 112-3 (e.g., the exposed surface of the bottom spacer 112-3). The sacrificial layers 114-1 and 114-2 function to protect the bottom spacers 112-1 and 112-2 and the bottom source/drain layer 106. In one embodiment, the sacrificial layers 114-1 and 114-2 can be formed by depositing a sacrificial material, and planarizing the sacrificial material to the height of the bottom spacer 112-3. The sacrificial layers 114-1 and 114-2 can include any suitable material in accordance with the embodiments described herein. For example, the sacrificial layers 114-1 and 114-2 can include, e.g., an oxide material.

Figure 4:
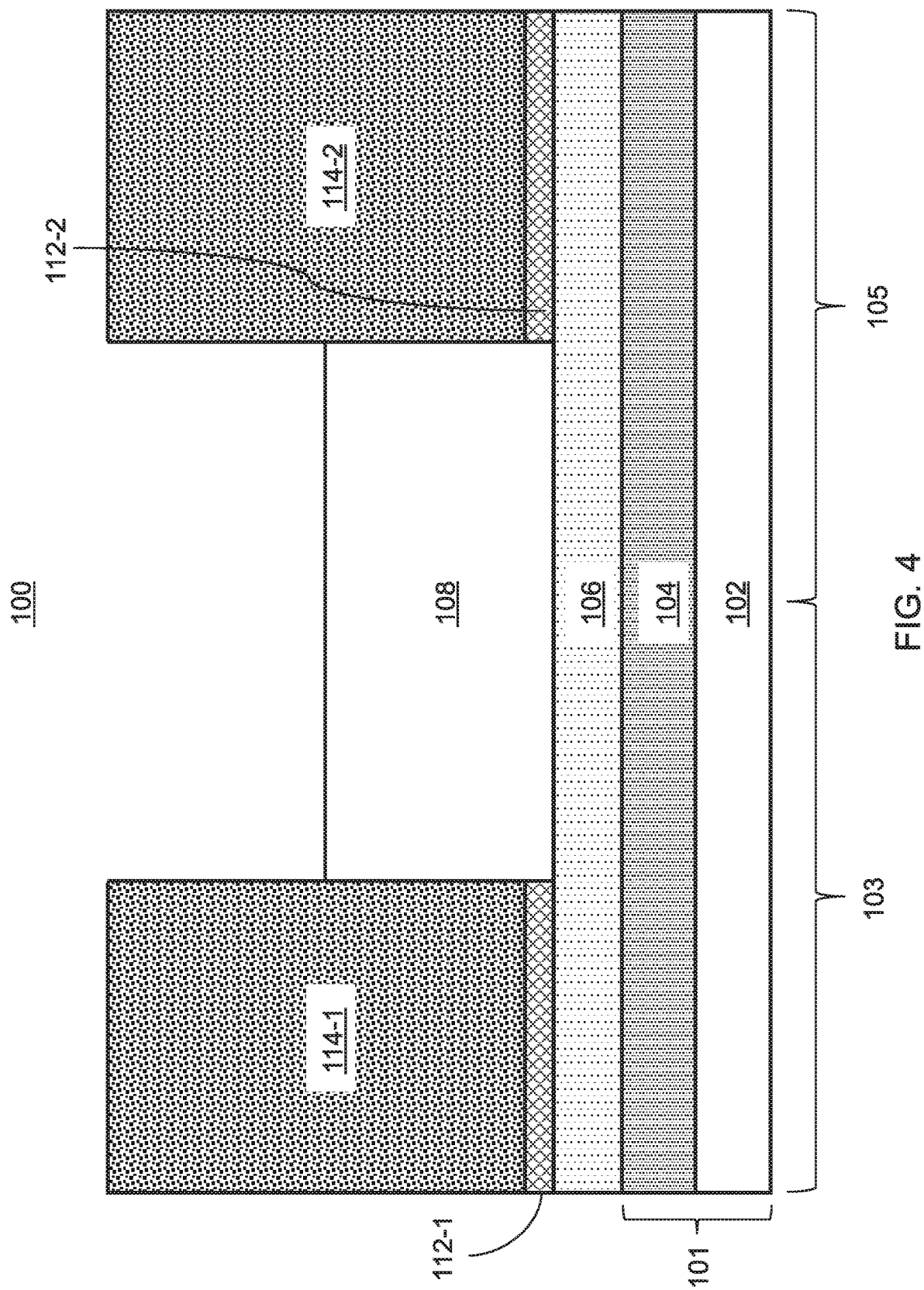
FIG. 4 is a cross-sectional view of the selective removal of bottom spacer material and the mask during the fabrication of a semiconductor device, in accordance with an embodiment of the present invention.

With reference to FIG. 4, the bottom spacer 112-3 and the mask layer 110 are selectively removed from the pillar 108. Any suitable process can be used to selectively remove the bottom spacer 112-3 and the mask layer 110 in accordance with the embodiments described herein.

Figure 5:
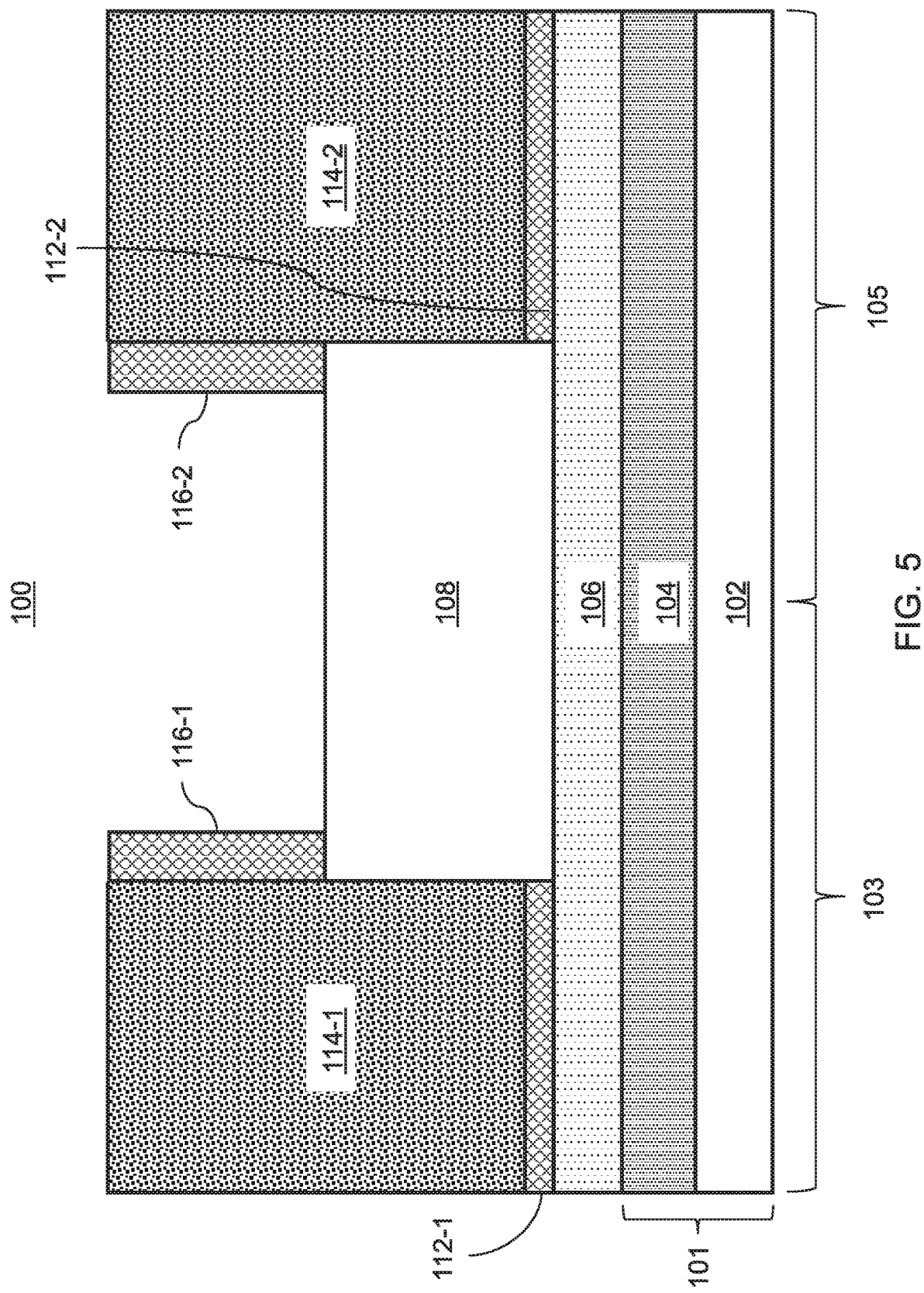
FIG. 5 is a cross-sectional view of the formation of sidewall spacers on sidewalls of the sacrificial layers during the fabrication of a semiconductor device, in accordance with an embodiment of the present invention.

With reference to FIG. 5, fin masks 116-1 and 116-2 are formed on the pillar 108 and sidewalls of the sacrificial layers 114-1 and 114-2, respectively. In one embodiment, the fin masks 116-1 and 116-2 can be formed by depositing spacer material, and etching the spacer material to remove portions of the spacer material to form the fin masks 116-1 and 116-2. Any suitable etch process can be used to remove the portions of the spacer material to form the fin masks 116-1 and 116-2 in accordance with the embodiments described herein (e.g., reactive-ion etching (RIE)). The fin masks 116-1 and 116-2 can include any suitable material in accordance with the embodiments described herein. For example, the fin masks 116-1 and 116-2 can include, e.g., a silicon nitride material (e.g., SiN).

Figure 6:
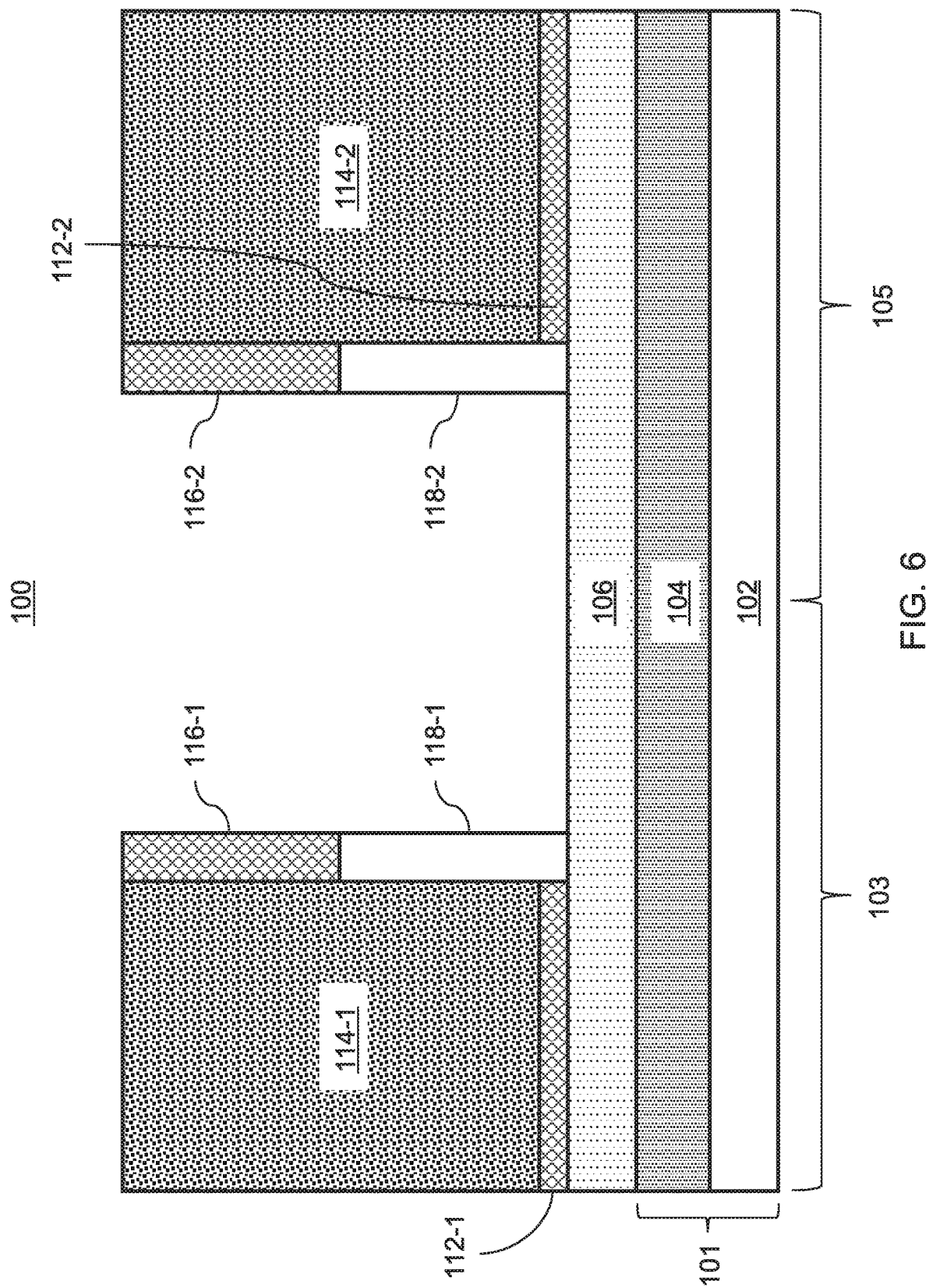
FIG. 6 is a cross-sectional view of the formation of fins from the channel layer during the fabrication of the semiconductor device, in accordance with an embodiment of the present invention.

With reference to FIG. 6, fins 118-1 and 118-2 are formed from the pillar 108. The fins 118-1 and 118-2 can be formed by etching material from the pillar 108, where the fin masks 116-1 and 116-2 function as mask layers during the formation of the fins 118-1 and 118-2 from the pillar 108. Any suitable etch process can be used to remove the material from the pillar 108 in accordance with the embodiments described herein (e.g., RIE).

Figure 7:
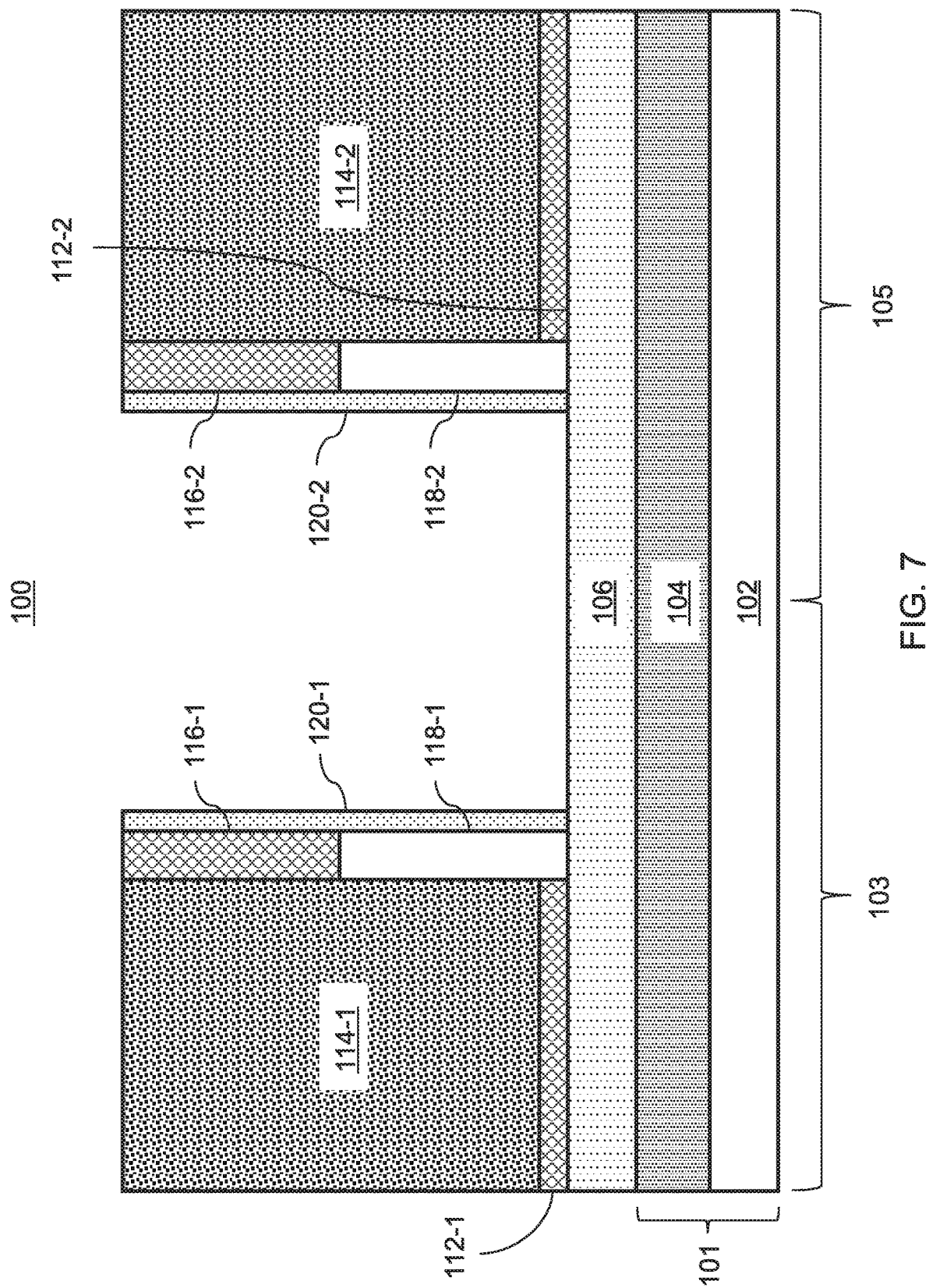
FIG. 7 is a cross-sectional view of the formation of sidewall spacers on exposed sidewalls of the fins during the fabrication of the semiconductor device, in accordance with an embodiment of the present invention.

With reference to FIG. 7, a sidewall spacer 120-1 is formed on the exposed sidewalls of the fin mask 116-1 and the fin 118-1, and a sidewall spacer 120-2 is formed on the exposed sidewalls of the fin mask 116-2 and the fin 118-2. As will be described in further detail below, the sidewall spacers 120-1 and 120-2 are used to decouple a gate structure on one side so that the gate structure on that side can be used as a resistive element. The sidewall spacers 120-1 and 120-2 can include any suitable material in accordance with the embodiments described herein. Examples of suitable materials that can be used to form the sidewall spacers 120-1 and 120-2 include, but are not limited to, $SiO_xN_y$, SiOCN, SiBCN, SiOC, etc.

Figure 8:
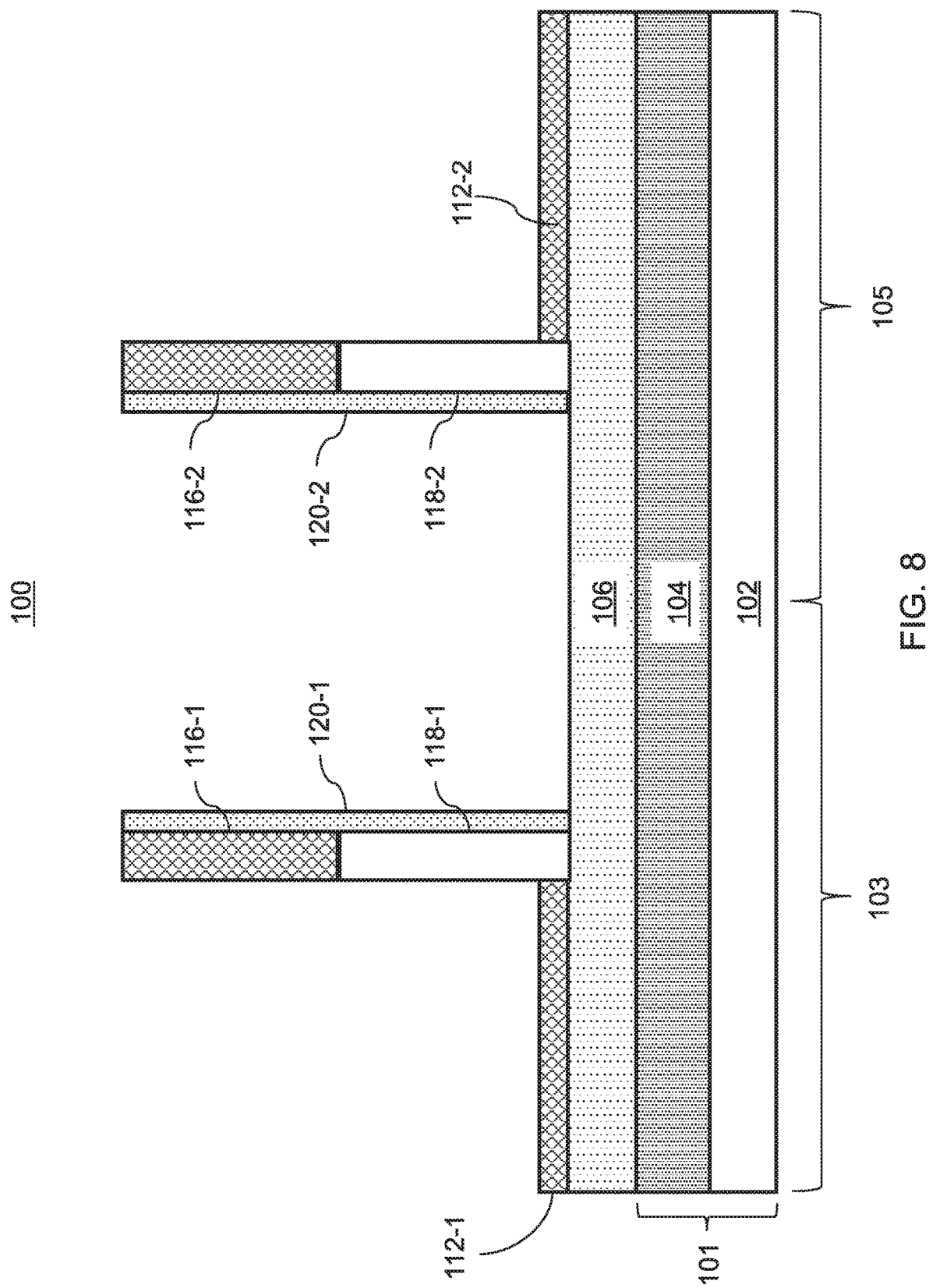
FIG. 8 is a cross-sectional view of the removal of the sacrificial layer during the fabrication of the semiconductor device, in accordance with an embodiment of the present invention.

With reference to FIG. 8, the sacrificial layers 114-1 and 114-2 are removed (e.g., stripped). Any suitable process can be used to remove the sacrificial layers 114-1 and 114-2 in accordance with the embodiments described herein.

As can be seen, the device shown in FIG. 8 has an asymmetry. More specifically, the bottom spacers 112-1 and 112-2 are formed on only one side of the fins 118-1 and 118-2, respectively. Additionally, the sidewall spacers 120-1 and 120-2 are formed on only the other side of the fins 118-1 and 118-2, respectively.

FIGS. 9-14 illustrate processing of the device 100 performed to create a transistor and the memory cell. For the sake of simplicity, the processing of the device 100 illustrated in FIGS. 9-14 will be shown with respect to the first region 103.

Figure 9:
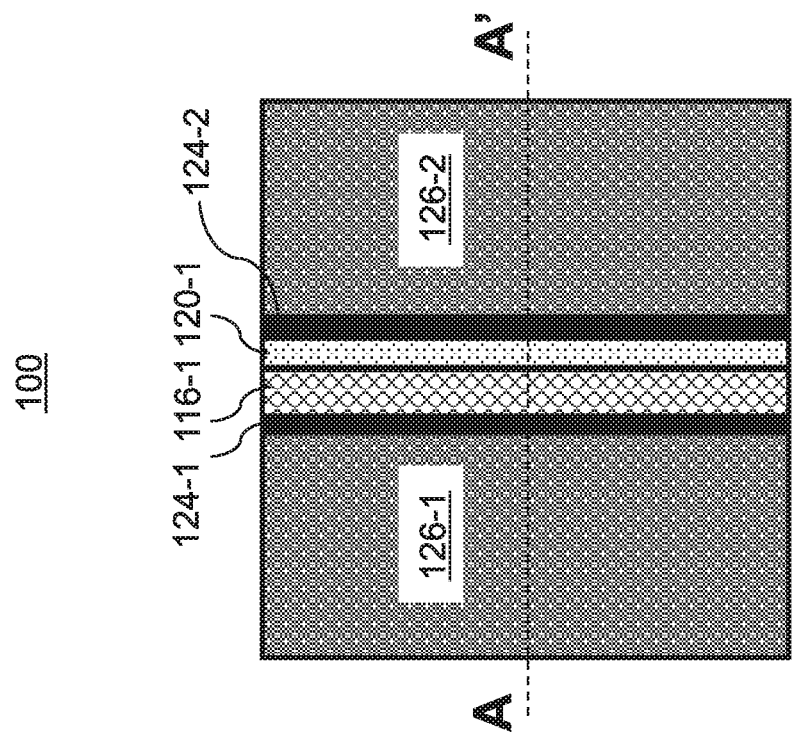
FIG. 9 is a top-down view of the formation of shallow trench isolation (STI) regions and gate material during the fabrication of the semiconductor device, in accordance with an embodiment of the present invention.

With reference to FIG. 9, a top-down view of the device 100 is shown after the formation of shallow trench isolation (STI) regions 122-1 and 122-2 (not shown in this view), and gate material including gate dielectric layers 124-1 and 124-2 and gate conductor layers 126-1 and 126-2 disposed on the gate dielectric layers 124-1 and 124-2, respectively. In an alternative embodiment, the sidewall spacer 120-1 can optionally be removed. Further details regarding the formation of the STI regions 122-1 and 122-2 and the gate material including the gate dielectric layers 124-1 and 124-2 and the gate conductors 126-1 and 126-2 will now be described below with reference to FIG. 10.

Figure 10:
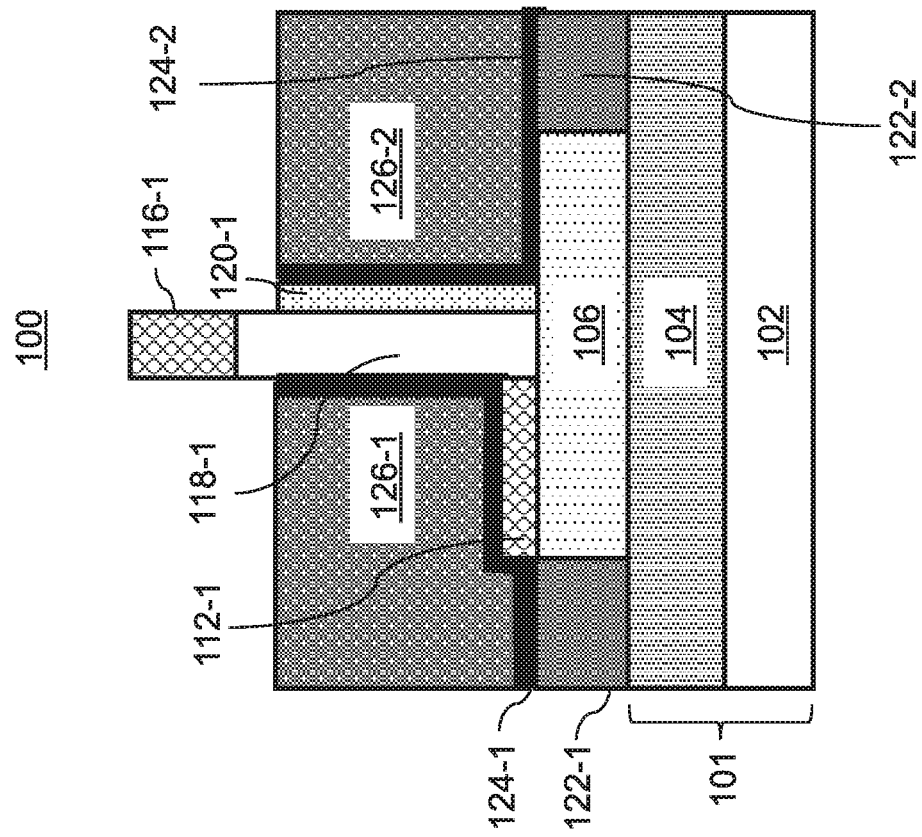
FIG. 10 is a cross-sectional view through the device shown in FIG. 9, in accordance with another embodiment of the present invention.

With reference to FIG. 10, a cross-sectional view through line A-A' of FIG. 9 is provided. As shown, the STI regions 122-1 and 122-2 are formed on the base substrate 101 (e.g., on the dielectric layer 104) adjacent to the bottom source/drain layer 106. The STI regions 122-1 and 122-2 function to isolate the device corresponding to the fin 118-1 from the device corresponding to the fin 118-2, and any other device adjacent to the fin 118-1. The STI regions 122-1 and 122-2 can be formed by removing portions of the bottom source/drain layer 106 and the bottom spacer 112-1 to form trenches, and depositing dielectric material within the trenches. The STI regions 122-1 and 122-2 can include any suitable material in accordance with the embodiments described herein (e.g., a silicon oxide material).

As further shown, shown, the gate material can be formed by conformally depositing the gate dielectric layer 124-1 along the STI region 122-1, the bottom spacer 112-1 and the fin 118-1, conformally depositing the gate dielectric layer 124-2 along the bottom source/drain layer 106, the STI region 122-2 and the sidewall spacer 120-1, depositing gate conductor material on the gate dielectric layers 124-1 and 124-2, and planarizing the gate conductor material to form the gate conductors 126-1 and 126-2 on the gate dielectric layers 124-1 and 124-2, respectively. In the alternative embodiment in which the sidewall spacer 120-1 is optionally removed, the gate dielectric layer 124-2 can be formed along the fin 118-1 (instead of the sidewall spacer 120-1).

The gate dielectric layers 124-1 and 124-2 can include any suitable dielectric material in accordance with the embodiments described herein. In one embodiment, the gate dielectric layers 124-1 and 124-2 can include a high-k dielectric material. As used herein, a high-k dielectric material refers to a dielectric material having a dielectric constant (k) higher than the dielectric constant of silicon oxide at room temperature (e.g., about 20° C. to about 25° C.) and atmospheric pressure (about 1 atm). For example, a high-k dielectric material can have a dielectric constant greater than 4.0. In another example, the high-k gate dielectric material can have a dielectric constant greater than 7.0. Examples of suitable high-k dielectric materials that the gate dielectric layers 124-1 and 124-2 can be formed from include, but are not limited to, hafnium oxides, hafnium silicon oxides, hafnium silicon oxynitrides, lanthanum oxides, lanthanum aluminum oxides, zirconium oxides, zirconium silicon oxides, zirconium silicon oxynitrides, tantalum oxides, titanium oxides, barium strontium titanium oxides, barium titanium oxides, strontium titanium oxides, yttrium oxides, aluminum oxides, lead scandium tantalum oxides, lead zinc niobates, etc. In one embodiment, the gate dielectric layers 124-1 and 124-2 each have a thickness ranging from, e.g., about 1 nm to about 10 nm. In another embodiment, the gate dielectric layers 124-1 and 124-2 can each have a thickness ranging from, e.g., about 1.5 nm to about 2.5 nm.

The gate dielectric layers 124-1 and 124-2 can be formed using a chemical vapor deposition (CVD) process and/or an atomic layer deposition (ALD) process. Variations of CVD processes suitable for depositing the at least one gate dielectric layers 124-1 and 124-2 include, but are not limited to, atmospheric pressure CVD (APCVD), low-pressure CVD (LPCVD), plasma-enhanced CVD (PECVD), metalorganic CVD (MOCVD), etc.

The gate conductors 126-1 and 126-2 can include any suitable conductive material in accordance with the embodiments described herein. Example of suitable conductive materials that the gate conductors 126-1 and 126-2 can be formed from include, but are not limited to metals, metal alloys, metal nitrides and metal silicides, as well as laminates thereof and composites thereof. Examples of suitable conductive materials that can be used to form the gate conductors 126-1 and 126-2 include, but are not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO$_2$), cobalt silicide (CoSi), nickel silicide (NiSi)), transition metal aluminides (e.g. Ti3Al, ZrAl), TaC, TaMgC, carbon nanotube, conductive carbon, graphene, etc. The conductive material can further include dopants that are incorporated during or after deposition.

As another example, the gate conductors 126-1 and 126-2 can include a doped semiconductor material. More specifically, such doped semiconductor materials can include, e.g., doped polysilicon and/or polysilicon-germanium alloy materials having a dopant concentration from, e.g., about $1\times10^{18}$ dopant atoms per cubic centimeter to about $1\times10^{22}$ dopant atoms per cubic centimeter, and/or polycide materials (e.g., doped polysilicon/metal silicide stack materials).

In some embodiments, the gate material can further include a work function setting layer (not shown) between the gate dielectric layers 124-1 and 124-2 and the gate conductors 126-1 and 126-2. The work function setting layer can include a work function metal (WFM). The WFM can include any suitable material including, but not limited to, a nitride (e.g., titanium nitride (TiN)), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), etc. In some embodiments, a conductive material or a combination of multiple conductive materials can serve as both gate conductor and WFM.

The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

The gate material connects by wrapping through the ends of the fin 118-1. As will be described in further detail below with reference to FIGS. 11 and 12, gate separation will occur by cutting the fin and gate material together. Accordingly, a self-aligned gate edge and fin edge can be enabled by cutting the fin and gate material together.

With reference to FIG. 11, a top-down view of the device 100 is shown after the gate material (e.g., dielectric layers 124-1 and 124-2 and the gate conductors 126-1 and 126-2) is patterned to form a first gate structure 127-1 including the gate dielectric layer 124-1 and the gate conductor 126-1 and a second gate structure 127-2 including the gate dielectric layer 124-2 and the gate conductor 126-2. The fin 118-1 and the bottom source/drain layer 106 can be cut together with the gate material so that the first gate structure 127-1 and the second gate structure 127-2 are separated.

With reference to FIG. 12, a cross-sectional view through line A-A' of FIG. 11 is provided showing the patterning performed to form the gate structures 127-1 and 127-2.

One of the first and second gate structures 127-1 and 127-2 can be used as the gate (e.g., wordline) of the VFET, while the other one of the first and second gate structures 127-1 and 127-2 can be used as an electrode of the resistive element (e.g., source line). Further details regarding the processing of the device to form the VFET and the resistive element will now be described below with reference to FIGS. 13-15.

Figures 13, 14:
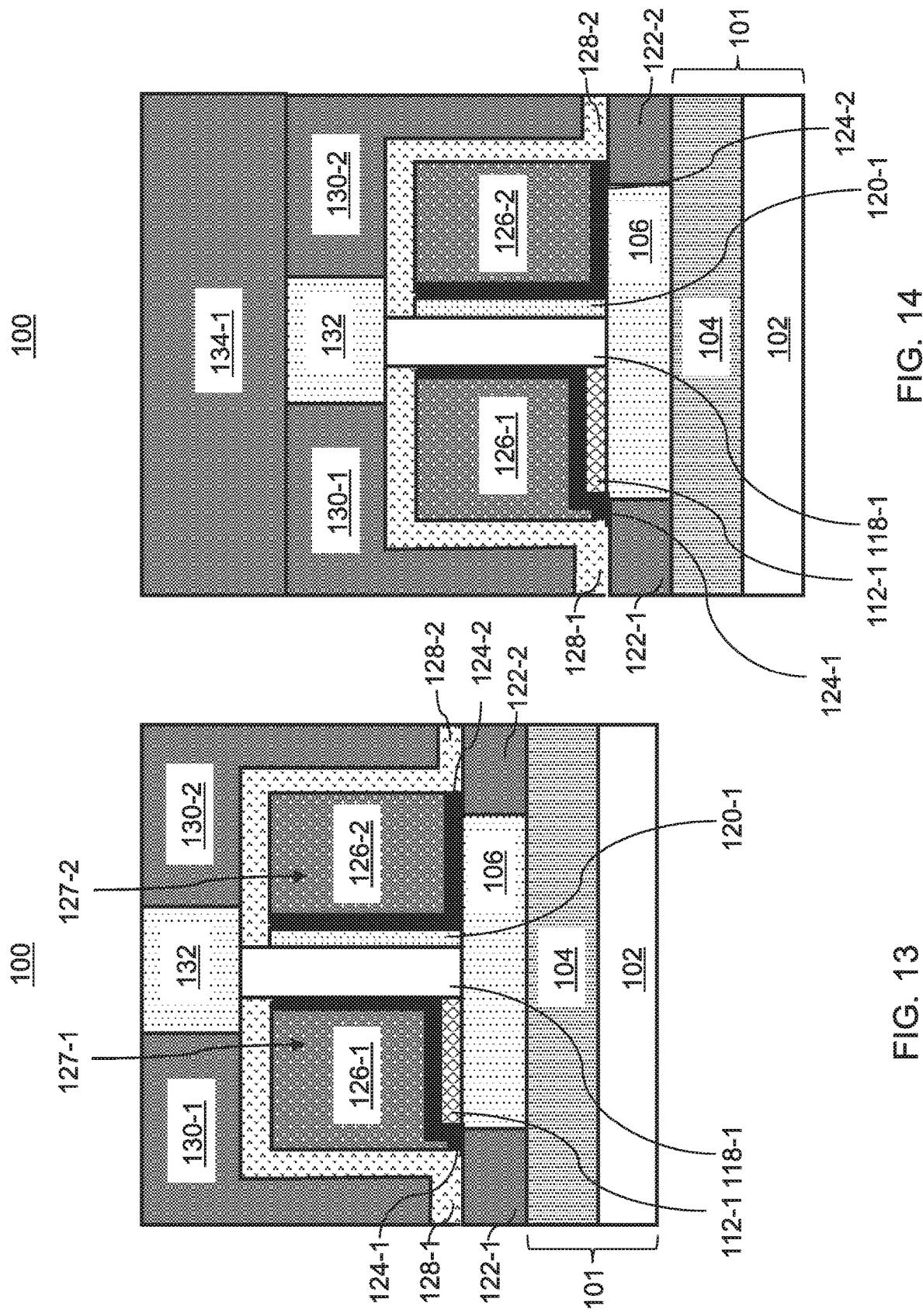
FIG. 13 is a cross-sectional view of the formation of a top spacer, a gate sidewall spacer, interlevel dielectric (ILD) portions and a top source/drain region during the fabrication of the semiconductor device, in accordance with an embodiment of the present invention.
FIG. 14 is a cross-sectional view of the formation of an ILD layer during the fabrication of the semiconductor device, in accordance with an embodiment of the present invention.

With reference to FIG. 13, a spacer layer 128-1 is formed along the STI region 122-1 and the first gate structure 127-1, and a spacer layer 128-2 is formed along the STI region 122-2 and the second gate structure 127-2. Each of the spacer layers 128-1 and 128-2 includes a top spacer portion and a gate sidewall spacer portion. The spacer layers 128-1 and 128-2 can include any suitable material in accordance with the embodiments described herein. For example, the spacer layer 128-1 and 128-2 can include, e.g., a ceramic material (e.g., SiBCN).

As further shown, interlayer dielectric (ILD) portions 130-1 and 130-2, and a top source/drain layer 132 are formed. The ILD portions 130-1 and 130-2 and the top source/drain layer 132 can be formed by depositing dielectric material on the spacer layers 128-1 and 128-2 and the fin 118-1, removing the fin mask 116-1, creating an opening within the dielectric material to form the ILD portions 128-1 and 128-2, and forming the top source/drain layer 132 within the opening.

The ILD portions 130-1 and 130-2 can include any suitable dielectric material in accordance with the embodiments described herein. For example, the ILD portions 130-1 and 130-2 can include, e.g., a silicon oxide material.

In one embodiment, the top source/drain layer 132 can include an epitaxially grown material. For example, the top source/drain layer 132 can include an n-type doped layer (e.g., phosphorus or arsenic doped silicon layer). However, such an embodiment should not be considered limiting. Alternatively, the top source/drain layer 132 can include a p-type doped layer (e.g., boron doped silicon germanium layer).

With reference to FIG. 14, an additional ILD layer 134 is formed on the ILD portions 130-1 and 130-2, and the top source/drain layer 132. The ILD layer 134 can include any suitable dielectric material in accordance with the embodiments described herein. For example, the ILD layer 134 can include, e.g., a silicon oxide material. The ILD layer 134 can include the same dielectric material as, or a different dielectric material from, the ILD portions 130-1 and 130-2.

Figure 15:
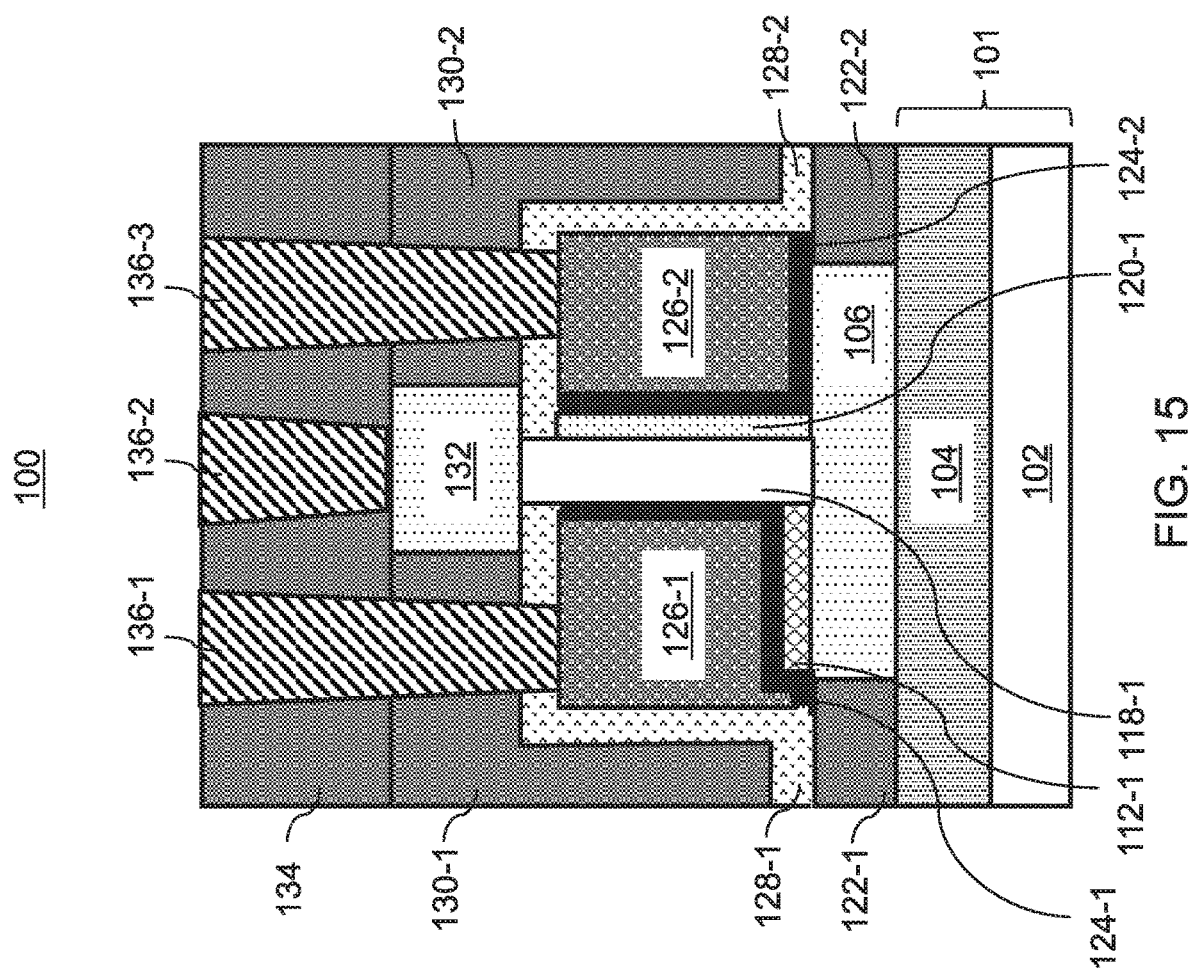
FIG. 15 is a cross-sectional view of the formation of contacts during the fabrication of the semiconductor device, in accordance with an embodiment of the present invention.

With reference to FIG. 15, contacts 136-1 through 136-3 are formed. More specifically, contact 136-1 can be formed by patterning a first via to the gate conductor 126-1 and filling the first via with a first conductive material, contact 136-2 can be formed by patterning a second via to the top source/drain layer 132 and filling the second via with a second conductive material, and contact 136-3 can be formed by patterning a third via to the gate conductor 126-2 and filling the third via with a third conductive material. That is, contacts 136-1 through 136-3 are shown as staggered contacts. Each of the contacts 136-1 through 136-3 can include a same conductive material, or at least one of the contacts 136-1 through 136-3 can include a different conductive material.

The contact 136-1 can correspond to a wordline (WL) contact, the contact 136-2 can correspond to a bitline (BL) contact, and the contact 136-3 can correspond to a source line (SL) contact. The following table provides exemplary voltages for programming and sensing:

TABLE 1

| Operation | BL | WL | SL |
|---|---|---|---|
| FORM | GND | Vdd (e.g., 0.7 V) | $V_{I/O}$ (e.g., 3.3 V) |
| SET | GND | Vdd | $V_{I/O}$ (e.g., 1.8 V) |
| RESET | GND | Vdd | $-V_{I/O}$ (e.g., 1.8 V) |
| READ | GND | Vdd | Vdd |
| Standby | GND | GND | GND |

Figure 16:
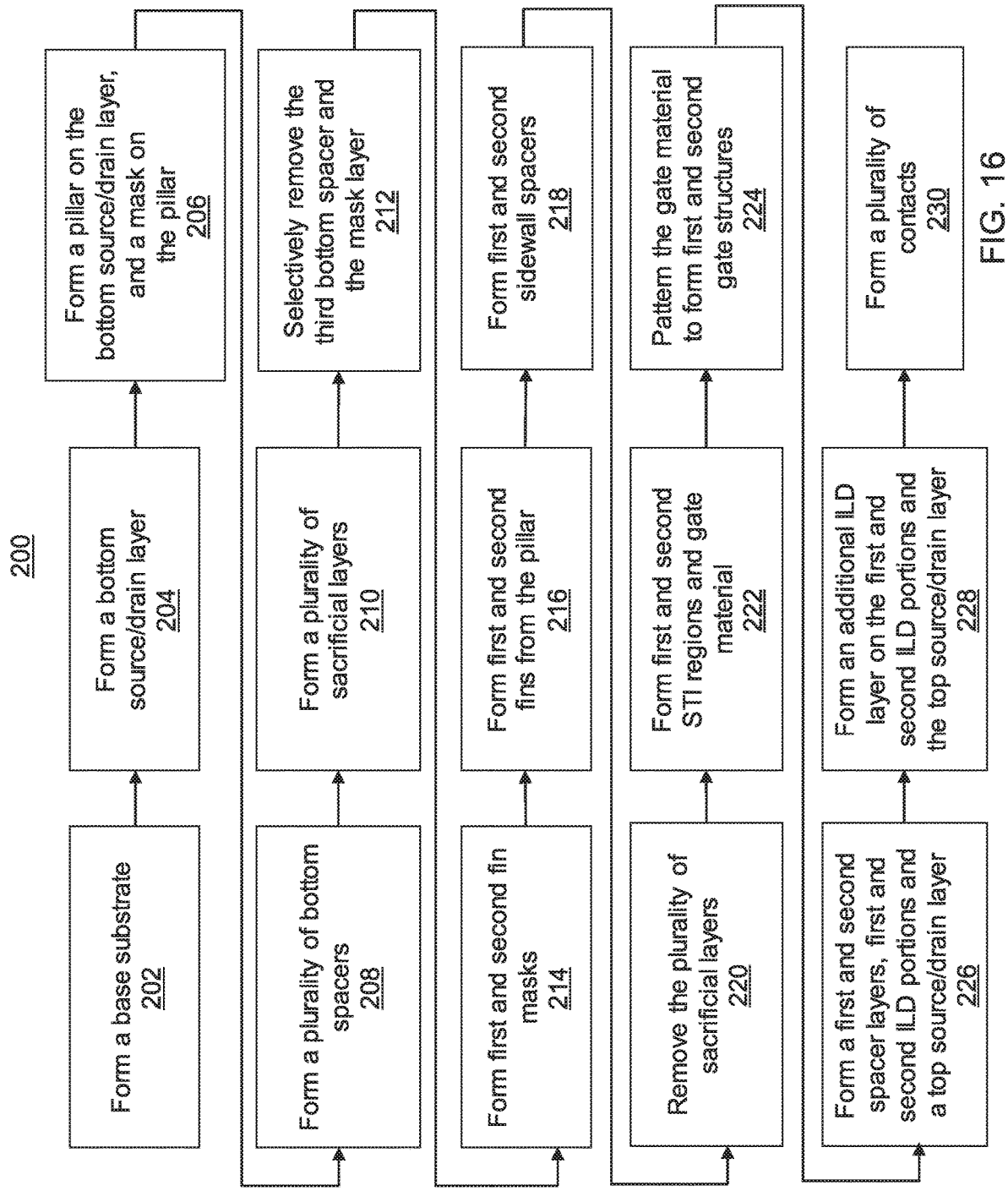
FIG. 16 is a block/flow diagram illustrating a system/method for fabricating a semiconductor device, in accordance with an embodiment of the present invention.

With reference to FIG. 16, a block/flow diagram is shown illustrating a system/method 200 for fabricating a semiconductor device including stacked access device and resistive memory, in accordance with an embodiment. The system/method 200 can concurrently form a vertical transistor and a resistive element on a base substrate (e.g., a 1T1R memory cell).

At block 202, a base substrate is formed. The base substrate can have a first portion corresponding to a first region of the device and a second portion corresponding to a second region of the device. The base substrate can include any suitable substrate structure, e.g., a bulk semiconductor, a semiconductor-on-insulator (SOI) substrate, etc. For example, if the base substrate is an SOI substrate, the base substrate can include a dielectric layer (e.g., buried oxide layer (BOX)) disposed on a semiconductor layer. If the base substrate is a bulk substrate, the dielectric layer is not present.

At block 204, a bottom source/drain layer is formed on the base substrate. For example, the bottom source/drain layer can be formed on the dielectric layer. In one embodiment, the bottom source/drain layer can include an n-type doped layer (e.g., N+ doped layer). However, such an embodiment should not be considered limiting.

In the embodiment where the base substrate includes an SOI substrate, the bottom source/drain layer can be formed by forming a semiconductor layer on top of the dielectric layer, and epitaxially growing material on the semiconductor layer with in-situ doping during epitaxy growth. Dopants can then be driven downwards into the semiconductor layer. The epitaxy layer, in conjunction with the semiconductor layer of the SOI substrate, can form the bottom source/drain layer.

In another embodiment where the base substrate includes an SOI substrate, the base substrate can include an SOI substrate with a pre-doped semiconductor layer on top of the dielectric layer to serve as the bottom source/drain layer. An SOI substrate can be formed by wafer bonding, SIMOX (Separation by Implanted Oxygen) method, or any other known method to form SOI substrates in accordance with the embodiments described herein.

In an alternative embodiment, if the base substrate includes a bulk semiconductor substrate (e.g., does not include the dielectric layer), the bottom source/drain layer can be grown directly on top of the base substrate.

At block 206, a pillar is formed on the bottom source/drain layer, and a mask layer is formed on the pillar.

Further details regarding blocks 202-206 are described above with reference to FIG. 1.

At block 208, a plurality of bottom spacers are formed. Forming the plurality of bottom spacers can include forming first and second bottom spacers on the bottom source/drain layer, and forming a third bottom spacer on the mask layer. In one embodiment, forming the plurality of bottom spacers can include using a directional deposition process to form bottom spacer material, and performing an etch back process to remove any extra bottom spacer material (e.g., remove bottom spacer material from the sidewalls of the pillar). Further details regarding block 208 are described above with reference to FIG. 2.

At block 210, a plurality of sacrificial layers is formed. Forming the plurality of sacrificial layers can include forming first and second sacrificial layers on the first and second bottom spacers, respectively, to a height of the third bottom spacer (e.g., the exposed surface of the third bottom spacer). The plurality of sacrificial layers function to protect the first and second bottom spacers and the bottom source/drain layer. In one embodiment, the plurality of sacrificial layers can be formed by depositing a sacrificial material, and planarizing the sacrificial material to the height of the bottom spacer. Further details regarding block 210 are described above with reference to FIG. 3.

At block 212, the third bottom spacer and the mask layer are selectively removed from the pillar. Any suitable process can be used to selectively remove the third bottom spacer and the mask layer in accordance with the embodiments described herein. Further details regarding block 212 are described above with reference to FIG. 4.

At block 214, first and second fin masks are formed. The first and second fin masks can be formed on the pillar and sidewalls of the first and second sacrificial layers, respectively. More specifically, forming the first and second fin masks can include depositing spacer material, and etching the spacer material to remove portions of the spacer material to form the first and second fin masks. Any suitable etch process can be used to remove the portions of the spacer material to form the first and second fin masks in accordance with the embodiments described herein (e.g., RIE). Further details regarding block 214 are described above with reference to FIG. 5.

At block 216, first and second fins are formed from the pillar. Forming the first and second fins can include etching material from the pillar, where the first and second fin masks function as mask layers during the formation of the first and second fins, respectively. Any suitable etch process can be used to remove the material from the pillar in accordance with the embodiments described herein (e.g., RIE). Further details regarding block 216 are described above with reference to FIG. 6.

At block 218, first and second sidewall spacers are formed. Forming the first and second sidewall spacers can include forming the first sidewall spacer on the exposed sidewalls of the first fin mask and the first fin, and forming the second sidewall spacer on the exposed sidewalls of the second fin mask and the second fin. As previously mentioned, the first and second sidewall spacers are used to decouple a gate structure on one side so that the gate structure on that side can be used as a resistive element. Further details regarding block 218 are described above with reference to FIG. 7.

At block 220, the plurality of sacrificial layers are removed (e.g., stripped). Any suitable process can be used to remove the plurality of sacrificial layers in accordance with the embodiments described herein. Further details regarding block 220 are described above with reference to FIG. 8.

The steps described by blocks 222-232 below are with reference to processing performed within at least the first region of the device.

At block 222, first and second STI regions and gate material are formed. The gate material can include first and second gate dielectric layers and first and second gate conductor layers disposed on the first and second gate dielectric layers, respectively. In an alternative embodiment, block 222 can further include removing the first sidewall spacer.

More specifically, the first and second STI regions can be formed on the base substrate adjacent to the bottom source/drain layer. Forming the first and second STI regions can include removing portions of the bottom source/drain layer and the bottom spacer to form trenches, and depositing dielectric material within the trenches to form the first and second STI regions.

Forming the gate material can include conformally depositing the first gate dielectric layer along the first STI region, the first bottom spacer and the first fin, conformally depositing the second gate dielectric layer along the bottom source/drain layer, the second STI region and the first sidewall spacer, depositing gate conductor material on the first and second gate dielectric layers, and planarizing the gate conductor material to form the first and second gate conductors on the first and second gate dielectric layers, respectively. In the alternative embodiment in which the first sidewall spacer is optionally removed, the second gate dielectric layer can be formed along the first fin (instead of the first sidewall spacer).

The first and second gate dielectric layers can be formed using a CVD process and/or an ALD process. Variations of CVD processes suitable for depositing the at least one gate dielectric layers 124-1 and 124-2 include, but are not limited to, APCVD, LPCVD, PECVD, MOCVD, etc.

In some embodiments, forming the gate material can further include forming a work function setting layer between the first and second gate dielectric layers 124 and the first and second gate conductors, respectively. The work function setting layer can include a work function metal (WFM). The gate conductor and the WFM can be formed by any suitable process or any suitable combination of multiple processes, including but not limited to, ALD, CVD, PVD, sputtering, plating, evaporation, ion beam deposition, electron beam deposition, laser assisted deposition, chemical solution deposition, etc.

Further details regarding block 222 are described above with reference to FIGS. 9 and 10.

At block 224, the gate material is patterned to form first and second gate structures. The first gate structure includes the first gate dielectric layer and the first gate conductor, and the second gate structure includes the second gate dielectric layer and the second gate structure. The first fin and the bottom source/drain layer can be cut together with the gate material so that the first and second gate structures are separated. One of the first and second gate structures can be used as the gate (e.g., wordline) of the VFET, while the other one of the first and second gate structures can be used as an electrode of the resistive element (e.g., source line). Further details regarding block 224 are described above with reference to FIGS. 11 and 12.

At block 226, first and second spacer layers, first and second interlayer dielectric (ILD) portions, and a top source/drain layer are formed. More specifically, the first spacer layer can be formed along the first STI region and the first gate structure, and the second spacer layer can be formed along the second STI region and the second gate structure. The first and second spacer layers can each include a top spacer portion and a gate sidewall spacer portion.

Forming the first and second ILD portions and the top source/drain layer can include depositing dielectric material on the first and second spacer layers and the first fin, removing the first fin mask, creating an opening within the dielectric material to form the first and second ILD portions, and forming the top source/drain layer within the opening. Forming the top source/drain layer can include epitaxially growing the top source/drain layer within the opening. For example, the top source/drain layer can include, e.g., an n-type doped layer (e.g., phosphorus or arsenic doped silicon layer). Alternatively, the top source/drain layer can include, e.g., a p-type doped layer (e.g., boron doped silicon germanium layer). However, such embodiments should not be considered limiting.

Further details regarding block 226 are described above with reference to FIG. 13.

At block 228, an additional ILD layer is formed on the first and second ILD portions, and the top source/drain layer. The additional ILD layer can include the same dielectric material as, or a different dielectric material from, the first and second ILD portions. Further details regarding block 230 are described above with reference to FIG. 14.

At block 230, a plurality of contacts are formed. More specifically, forming the plurality of contacts can include forming a first contact by patterning a first via to the first gate conductor and filling the first via with a first conductive material, forming a second contact by patterning a second via to the top source/drain layer and filling the second via with a second conductive material, and forming a third contact by patterning a third via to the second gate conductor and filling the third via with a third conductive material. Each of the plurality of contacts can include a same conductive material, or at least one of the plurality of contacts can include a different conductive material. The first contact can correspond to a wordline (WL) contact, the second contact can correspond to a bitline (BL) contact, and the third contact can correspond to a source line (SL) contact.

With reference to FIG. 17, a processing device 300 is shown in accordance with one implementation of the present invention. The device 300 can employ very-large-scale integration (VLSI) systems including electronic analog circuits. In one embodiment, the device 300 is a neuromorphic processing device including a neuromorphic processor or neural network to mimic neuro-biological architectures present in the nervous system. The device 300 can describe analog, digital, and/or mixed-mode analog/digital VLSI and software systems that implement models of neural systems. The implementation of the device 300 can be realized using an array 18 of cells or nodes 16. The cells or nodes 16 can include resistive random access memory (ReRAM) devices, oxide-based memristors, etc. The device 300 can include inputs 12 (e.g., $X_1$, $X_2$, $X_3$, . . . ). Inputs 12 can include an electrical characteristic, such as, e.g., a voltage. The device 300 can include a set of outputs 14 (e.g., currents: $Y_1$, $Y_2$, $Y_3$, $Y_4$, . . . ).

With reference to FIG. 18, a schematic diagram 400 is provided showing the array 18 of FIG. 17 in greater detail. The array 18 can include conductors 20 and conductors 22 running transversely to each other. The conductors 20 and 22 do not connect directly at intersection points as the conductors 20 and 22 are disposed on different levels. Instead, the conductors 20 and 22 are connected through resistive cross-point devices 24 located at each node 16.

Resistive cross-point devices 24 provide a highly parallel and scalable architecture composed of resistive devices for back-propagating neural networks. The devices 24 can include resistive random access memory (ReRAM) devices.

The cross-point devices 24 are configured to alter input signals and store data information. The cross-point devices 24 can be configured to implement algorithms or other functions. In other applications, fast and scalable architectures for matrix operations (e.g., inversion, multiplications, etc.) with cross-point devices 24 can be achieved. In one example, for forward matrix multiplication, voltages ($V_1$, $V_2$, $V_3$, etc.) can be supplied on conductors 22 in rows, and currents ($I_1$, $I_2$, $I_3$, $I_4$, etc.) can be read from conductors 20 in columns. Conductance values σ can be stored as weights. The conductance values in the array 18 include $\sigma_{11}$, $\sigma_{12}$, $\sigma_{13}$, $\sigma_{21}$, $\sigma_{22}$, $\sigma_{23}$, $\sigma_{31}$, $\sigma_{32}$, $\sigma_{33}$, $\sigma_{41}$, $\sigma_{42}$, $\sigma_{43}$, etc. In one example, $I_4=V_1\sigma_{41}+V_2\sigma_{42}+V_3\sigma_{43}$.

For backward matrix multiplication, the voltages can be supplied on the columns (20) and current can be read from the rows (22). In one embodiment, weight updates can be achieved when voltages are applied on the rows and columns at the same time. The conductance values can be updated in parallel. It should be understood that the function and position of rows and columns are interchangeable, and the columns and rows can be switched. In some embodiments, pre-neurons or post-neurons can be connected to rows and columns to provide preprocessing or postprocessing functions to operations performed by the array.

FIGS. 17 and 18 describe an application of ReRAM for neuromorphic computing (or sometimes referred as analog computing). When using a resistive memory cell (e.g., 1T1R cell) as described herein above with reference to FIGS. 1-16 in such a neuromorphic computing application, the source of the vertical transistor in each memory cell can be electrically connected to a source line (e.g., row), and the terminal of the resistive element that is not connected to the transistor can be connected to a bitline (e.g., column). The gate of the vertical transistor in each memory cell can be electrically connected to a wordline (not shown in FIG. 18). In some embodiments, a voltage can applied to all gates (e.g., wordlines) so that during the neuromorphic operation, all transistors are in the 'ON' state and the resistive memory cell functions as a two-terminal resistive element through the orthogonal source lines and bitlines.

Figure 19:
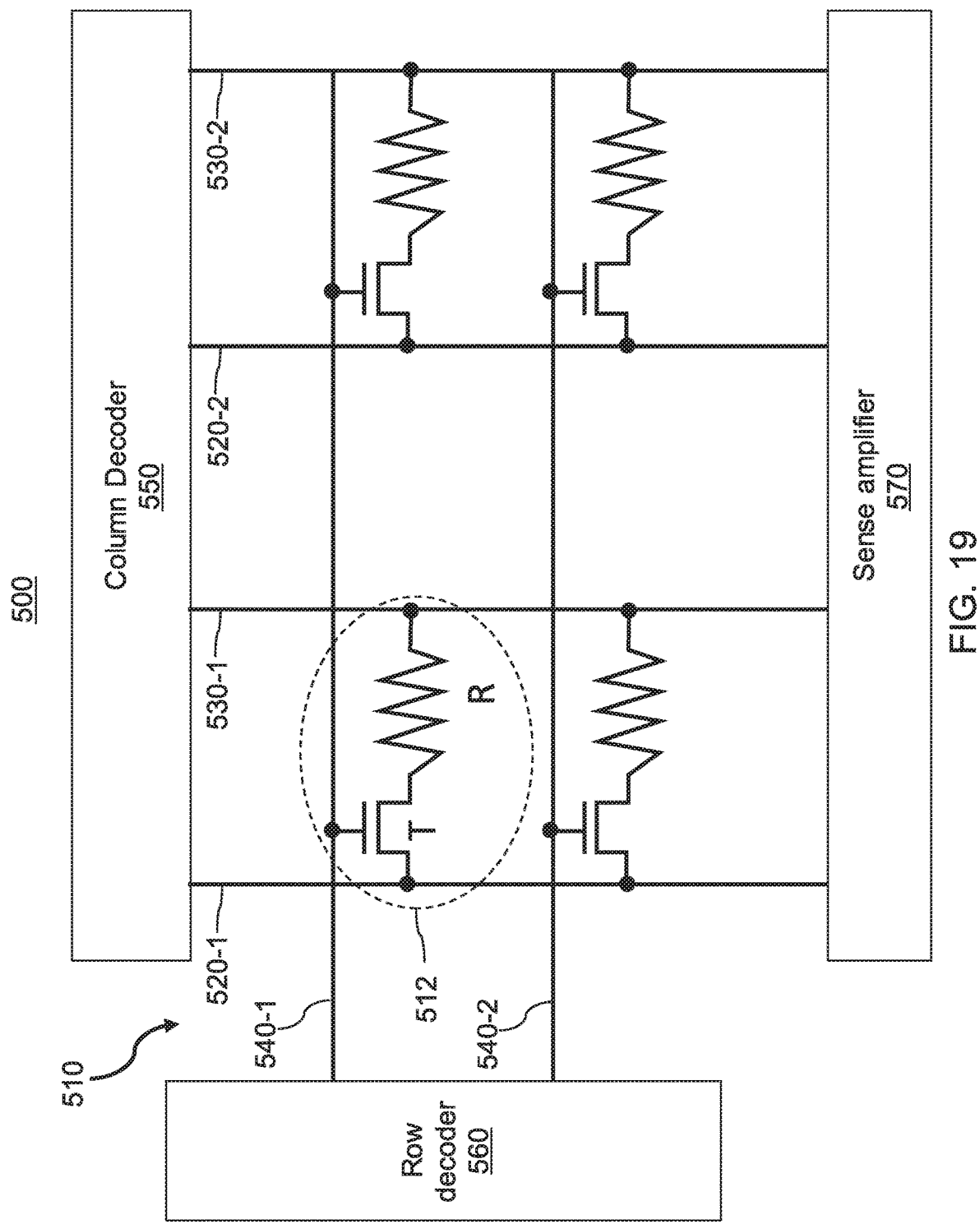
FIG. 19 is a diagram of a memory device, in accordance with an embodiment of the present invention.

With reference to FIG. 19, a diagram is provided illustrating a memory device 500. As shown, the memory device includes can include a memory cell array ("array") 510. The array 510 can include a plurality of memory cells, including memory cell 512. In the illustrative embodiment of FIG. 19, the array 510 is a 2×2 array including 4 memory cells. However, the array 510 can be any suitable m×n array including m rows and n columns of memory cells, where m and n are natural numbers.

Each of the plurality of memory cells (e.g., memory cell 512) can include one transistor ("T") and one resistive memory element ("R") forming a 1T1R memory cell. For example, at least one of the plurality of memory cells of the array 510 (e.g., the memory cell 512) can be a memory cell as described above with reference to FIGS. 1-16.

As further shown, the device 500 can include a plurality of lines. More specifically, the device 500 can include source lines 520-1 and 520-2, bitlines 530-1 and 530-2, and wordlines 540-1 and 540-2. The source lines 520-1 and 520-2 and the bitlines 530-1 and 530-2 can be coupled to a column decoder 550, and the wordlines 540-1 and 540-2 can be coupled to a row decoder 560.

For each of the plurality of memory cells in the array 510 (e.g., memory cell 512), the gate can be coupled to a wordline (e.g., the gate of transistor T of memory cell 512 is coupled to wordline 540-1), the source/drain can be coupled to a source line (e.g., the source/drain of transistor T of memory cell 512 is coupled to source line 520-1), the drain/source can be coupled to a first terminal of the resistive element (e.g., the drain/source of transistor T of memory cell 512 is coupled to a first terminal of resistive element R of memory cell 512), and a second terminal of the resistive element can be connected to a bitline (e.g., the second terminal of resistive element R of memory cell 512 is coupled to bitline 530-1.

As further shown, the device 500 can include a sense amplifier 570. The sense amplifier 570 is configured to read data from the device 500 by sensing a signal from a bitline and amplifying the sensed signal to recognizable logic levels to properly interpret the data. More specifically, each of the plurality of memory cells of the array 510 can be accessed through a wordline, bitline and source line so that it can be programmed to a logic state (e.g., "1" or "0"), and read by sense amplifier 570.

Having described preferred embodiments of a semiconductor device including a resistive memory cell having a single fin and a method of fabricating the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device including a resistive memory cell having a single fin, comprising:
   concurrently forming a vertical transistor and a resistive element on a base substrate, including:
   forming a bottom spacer layer on a bottom source/drain layer and on a mask layer, the mask layer being disposed on a pillar on top of the bottom source/drain layer;
   removing the mask layer and the bottom spacer layer from the pillar;
   forming a fin from the pillar by removing a portion of the pillar after removing the mask layer and the bottom spacer layer, wherein the fin is on top of the bottom source/drain region;
   forming a sidewall spacer on a sidewall of the fin;
   forming a gate dielectric layer on the sidewall of the sidewall spacer and on the sidewall of the fin opposite the sidewall spacer;
   forming a gate conductor layer on the gate dielectric layer on opposite sides of the fin, wherein the gate dielectric layer and the gate conductor layer forms the resistive element;
   forming a top source/drain layer on the fin; and
   forming a contact to the top source/drain layer;
   further comprising forming at least one sacrificial layer, the at least one sacrificial layer being formed on the bottom spacer layer adjacent to the pillar; and
   further comprising removing the at least one sacrificial layer prior to forming the gate dielectric layer on the sidewall of the fin.

2. The method of claim 1, further comprising:
   forming the bottom source/drain layer on the base substrate;
   forming the pillar on the bottom source/drain layer; and
   forming the mask layer on the pillar.

3. The method of claim 1, wherein removing the mask layer and the bottom spacer layer on the mask layer further includes selectively removing the bottom spacer layer on the mask layer and the mask layer from the pillar after forming the at least one sacrificial layer.

4. The method of claim 1, wherein forming the fin from the pillar further includes: forming a fin mask on the pillar and a sidewall of the at least one sacrificial layer; and etching material from the pillar using reactive ion etching to form the fin.

5. The method of claim 4, further comprising:
   forming first and second shallow trench isolation (STI) regions on the base substrate adjacent to the bottom source/drain layer;
   forming a top spacer layer on the gate conductor layer; and
   depositing an interlayer dielectric layer (ILD) on the top spacer layer.

6. The method of claim 5, further comprising forming a first contact to the gate conductor on the side of the fin without the sidewall spacer; and
   forming a second contact to the gate conductor on the side of the fin with the sidewall spacer.

7. The method of claim 6, wherein the first contact corresponds to a wordline contact, and the second contact corresponds to a source line contact.

8. A method for fabricating a semiconductor device including a resistive memory cell having a single fin, comprising:
   concurrently forming a vertical transistor and a resistive element on a base substrate, including:
   forming a bottom spacer layer on a bottom source/drain layer and a mask layer, wherein the mask layer is on a pillar on the bottom source/drain layer;
   removing the mask layer and the bottom spacer layer on the pillar;
   forming a fin from the pillar after removing the mask layer and the bottom spacer layer by etching material from the pillar to form the fin;
   forming a sidewall spacer on the fin;
   forming a gate dielectric layer on the sidewall of the sidewall spacer and on the sidewall of the fin opposite the sidewall spacer;
   forming a gate conductor layer on the gate dielectric layer on opposite sides of the fin, wherein the gate dielectric layer and the gate conductor layer forms the resistive element;
   forming first and second shallow trench isolation (STI) regions on the base substrate adjacent to the bottom source/drain layer;
   forming a top source/drain layer on the at least one fin; and
   forming a plurality of contacts, including forming a wordline contact corresponding to the first gate structure, a bitline contact corresponding to the top source/drain region and a source line contact corresponding to the second gate structure;
   further comprising: forming the bottom source/drain layer on the base substrate;
   forming the pillar on the bottom source/drain layer;
   forming the mask layer on the pillar;
   forming at least one sacrificial layer, the at least one sacrificial layer being formed on the first bottom spacer layer to a height of the bottom spacer layer on the pillar, wherein removing the mask layer and the bottom spacer layer on the pillar further includes selectively removing the bottom spacer layer and the mask layer from the pillar after forming the at least one sacrificial layer.

9. The method of claim 7, wherein forming the fin from the pillar further includes forming at least one fin mask on the pillar and a sidewall of the at least one sacrificial layer, wherein the at least one sidewall spacer is further formed on the at least one fin mask.

10. The method of claim 9, further comprising:
forming a first spacer layer along the first STI region and the first gate structure, and a second spacer layer along the second STI region and the second gate structure;
depositing dielectric material on the first and second spacer layers and the at least one fin;
removing the at least one fin mask;
creating an opening within the dielectric material to form first and second interlayer dielectric (ILD) portions;
epitaxially growing material within the opening to form the top source/drain region; and
forming an additional ILD layer on the first and second ILD portions and the top source/drain region.

11. The method of claim 10, wherein:
forming the wordline contact includes further includes patterning a first via to the first gate structure, and filling the first via with a first conductive material;
forming the bitline contact further includes patterning a second via to the top source/drain layer, and filling the second via with a second conductive material; and
forming the source line contact further includes patterning a third via to the second gate structure, and filling the third via with a third conductive material.

12. The method of claim 8, further comprising removing the at least one sidewall spacer prior to forming the gate dielectric layer on the sidewall of the sidewall spacer and on the sidewall of the fin opposite the sidewall spacer.

* * * * *